United States Patent [19]

Togashi et al.

[11] 4,430,648
[45] Feb. 7, 1984

[54] COMBINATION MATRIX ARRAY DISPLAY AND MEMORY SYSTEM

[75] Inventors: Seigo Togashi; Akira Tsuzuki, both of Tokorozawa, Japan

[73] Assignee: Citizen Watch Company Limited, Tokyo, Japan

[21] Appl. No.: 224,600

[22] Filed: Jan. 12, 1981

[30] Foreign Application Priority Data

Jan. 22, 1980 [JP] Japan .................................. 55-006479

[51] Int. Cl.³ .............................................. G09G 3/00
[52] U.S. Cl. ....................................... 340/718; 340/784; 340/799; 340/811
[58] Field of Search ................ 340/706, 707, 708, 798, 340/799, 802, 811, 718, 719, 784, 785, 814

[56] References Cited

U.S. PATENT DOCUMENTS

| | | | |
|---|---|---|---|
| 3,851,185 | 11/1974 | Hatsukano et al. | 340/814 |
| 3,909,822 | 9/1975 | Lee et al. | 340/814 |
| 4,110,662 | 8/1978 | Greeneich et al. | 340/719 |
| 4,129,858 | 12/1978 | Hara | 340/799 |
| 4,190,831 | 2/1980 | Stahle et al. | 340/799 |
| 4,228,431 | 10/1980 | Barclay | 340/719 |
| 4,236,150 | 11/1980 | Chern | 340/784 |
| 4,246,578 | 1/1981 | Kawasaki et al. | 340/799 |

*Primary Examiner*—Marshall M. Curtis
*Attorney, Agent, or Firm*—Jordan and Hamburg

[57] ABSTRACT

A display device of solid-state matrix type, such as a liquid crystal display device, retains display data for an unlimited period after such data has been written into the display, with no need for periodic re-writing of the display data to compensate for deterioration due to leakage effects. In addition, the display data can be read out again, if required, so that the display device can also be used as a memory. such a display device can also be utilized to perform data input, by writing in of data through application of light to the display surface, such as by using a light pen.

4 Claims, 5 Drawing Figures

COMBINATION MATRIX ARRAY DISPLAY AND MEMORY SYSTEM

BACKGROUND OF THE DISCLOSURE

The present invention is directed toward a solid-state display device of matrix configuration, in which a switching element is provided on the display panel for each of the display elements.

At present, various types of solid-state display devices are in wide use in a broad range of electronic equipment. Such display devices generally utilize liquid crystal electro-optical effects, or other electro-optical effects including electrochromism or electroluminescense, and due to their advantages which include compactness, low power consumption and light weight, are especially suited to such applications as electronic timepieces, pocket calculators, and similar equipment. In future, it is anticipated that the applications of such display devices will be extended to, for example, miniature portable television receivers, computer peripheral equipment, etc. In the case of equipment such as television receivers, a high degree of display element density is required. In such cases, a matrix type of display arrangement is generally adopted, in order to minimize as far as possible the number of interconnecting leads between the display panel and the circuitry which drives the display elements, i.e. the peripheral circuitry. In such a display device, display elements are selected and driven by means of a plurality of row and column electrodes. However, it has been found that the level of cross-talk interference in a simple matrix display of liquid crystal type, for example, is too high to permit a usefully large size of matrix display to be utilized. Because of this, a method was proposed whereby an individual switching element is provided for each of the display elements. This method, which enables cross-talk to be virtually eliminated, is referred to as the "built-in switching element" method in the present disclosure, and was first proposed by B. J. Leichner et al (Proc. IEEE, Vol. 59, Nov. 1971, P. 1566 to 1599).

Theoretically, such a display device should provide a performance which is comparable to that which can be obtained with a cathode ray tube type of display, while also providing the advantages of low power dissipation and capability of operating at low levels of supply voltage. However, it has been found that, in practice, such performance has not been obtained with prior art display devices of the built-in switching element type, due to various disadvantages. One of these disadvantages is that the display elements have a finite resistance, and as a result of this, and also the leakage resistance of the switching elements coupled to the display elements, the contents of the display elements gradually deteriorate, i.e. the charge which is established in the display element when display data is written in, gradually discharges. It is therefore necessary to periodically and repetitively rewrite the display data into the display elements, on a continuous basis. If the display data is not available continuously from an external source, then this means that it is necessary to provide some type of memory means to store the display data, i.e. a memory whose capacity is at least as great as the number of display elements. In the case of a high-density type of display, this requirement is a very serious disadvantage. Another disadvantage which results from the need to repetitively write in the display data to the display elements is that since deterioration of the display contents occurs at quite a rapid rate, it is necessary to rewrite the data fairly rapidly. Since the display data is generally transferred from an external source or from an internal memory in serial form, to be written in, it is necessary to provide some means of serial to parallel conversion to apply this data to the display matrix, and so this serial to parallel conversion circuitry must contain elements which operate at a high switching rate. This means that a substantial amount of power will be dissipated in such circuitry, and that the area required for the circuit elements will be substantial. In addition, since it is difficult to form thin-film semiconductor devices which operate at high switching speeds, it is not feasible to provide such serial to parallel conversion circuitry upon the display panel itself, in the same way as the switching elements of the display elements are formed.

Another disadvantage of such prior art display devices is that it is only possible to write in data to be displayed, and not to readout the contents of the display.

The various disadvantages of prior art display devices of matrix type having built-in switching elements are eliminated by a display device according to the present invention. Regeneration of the contents of the display elements is performed periodically and automatically on the basis of the contents themselves, and not on the basis of externally stored data. Thus, it is not necessary to use a memory circuit, or to provide serial to parallel conversion circuit means operating at high switching speeds. Thus, the overall configuration of a display device according to the present invention can be simplified, by comparison with prior art devices, and the size and power consumption can be reduced. In addition, data can be read out from the display elements of a display device of the present invention, as well as being written in. Thus, the display elements can be used as data storage elements. Moreover, it is possible to write in data to the display device by application of a light pen or other suitable light source to the display panel, in a similar manner to that of a cathode ray tube display device having a light pen data input capability.

SUMMARY OF THE INVENTION

The present invention relates to a display device of matrix type, such as a liquid crystal display device, in which a switching element is provided upon the display panel for each of the display elements, i.e. a display device of the "built-in switching element" type. A display device according to the present invention is characterized in that the contents of each display element (i.e. the potential established between the display electrode of a display element and the reference electrode potential) is periodically "refreshed", i.e. is regenerated, to thereby compensate for any reduction of this potential due to leakage current through the display element or the switching element. This regeneration is performed without the need for rewriting of the display data from an external memory circuit, so that the usual requirement for such a memory in prior art display devices of the matrix type is completely eliminated. The regeneration of the display element contents is performed by circuits coupled to each of the column electrodes of the display matrix, referred to hereinafter as sense/refresh circuits.

A display device according to the present invention can function in three basic operating modes. In one of these, the write-in mode, display data can be written into the display section from a source of display data signals, to be stored in the display elements by the capacitance of each element, as in the case of a prior art type of display device of built-in switching element type. Another mode is the sense-refresh mode, in which the contents of the display elements are periodically "refreshed", i.e. the voltage between the display electrode and the reference electrode of each display element is restored to the value which was established when data was written into that display element in the write-in mode. As will be described with reference to preferred embodiments, this mode is based upon sensing the contents of each display element, and then restoring the contents to their original condition on the basis of this sensing operation, i.e. refreshing the data contents. A third mode of operation is the readout mode, in which the contents of each row of display elements or of individual display elements can be read out to external circuitry. This mode enables a display device according to the present invention to be used as a type of memory device. In addition, it is possible to establish a fourth mode of operation, in which data is written into the display device by application of light from a source such as a light pen to selected display elements. The display data thus written in will thereafter be stored in the same way as in the first write-in mode referred to above.

Another advantage of a display device according to the present invention is that it is not necessary to use switching devices having a very high speed switching capability, for the circuits which perform a sense/refresh function or for any other circuits coupled peripherally to the display section. This is due to the fact that it is not necessary to periodically rewrite the display data into the display section, to compensate for leakage effects, by utilizing perpheral circuitry which performs high-speed serial to parallel conversion operations. Such circuitry is generally required with prior art display devices of the built-in switching element matrix type. Thus, with a display device according to the present invention, such peripheral circuitry can be formed directly upon the display panel itself, using for example thin-film field effect transistors of relatively low switching speed capability. Thus, a display device according to the present invention can be made very compact, and is therefore highly suitable for application to compact and portable electronic equipment. In addition, since high-speed switching of circuit elements is not necessary, the overall power consumption of a display device according to the present invention can be made considerably less than that of a display device of the prior art.

It is therefore an object of the present invention to provide a solid-state display device having both a write-in mode of operation and a readout mode of operation, in addition to a sense/refresh mode of operation.

It is a further object of the present invention to provide a solid-state display device of matrix type, wherein the display contents thereof are retained in the display elements of said display device without the necessity for periodically rewriting said display contents into said display elements from an external source of display data or from a memory circuit storing such display data.

It is yet another object of the present invention to provide a solid-state display device whereby writing in of data to a display panel can be performed by application of light from a light pen or other light source to selected display elements on said display panel.

DESCRIPTION OF THE PREFERRED EMBODIMENT

Figure 1:
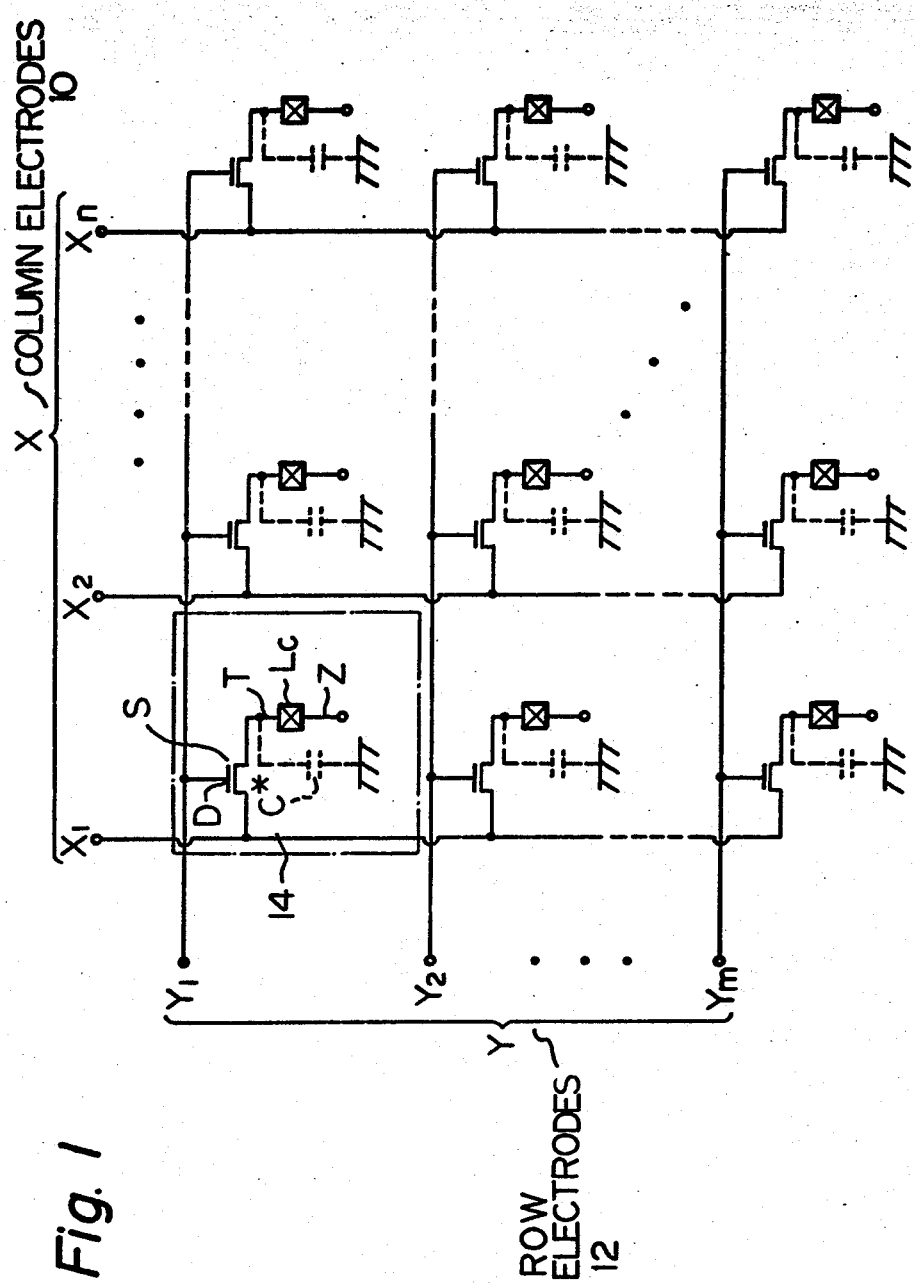
FIG. 1 is a partial circuit diagram of the display section of a display device of the built-in switching element type.

Before describing an embodiment of a display device according to the present invention, a brief description of the basic features of a display device of the built-in switching element type will be given. Referring first to FIG. 1, a partial circuit diagram of the display section (i.e. the matrix array of display elements and switching elements) of such a display device is shown. Here, the display section comprises a plurality of row electrodes 12 ($Y_1 \ldots Y_m$) and a plurality of column electrodes 10 ($X_1 \ldots X_n$), arranged in matrix formation. Adjacent to each intersection of these row and column electrodes, a switching element is provided, denoted by S in FIG. 1, and a display element LC are provided. In this example, the switching elements can be assumed to comprise thin-film field effect transistors for example, with the gate electrode D of each switching element in a row of such electrodes being coupled to one of the row electrodes 12, such as $Y_1$. Each display element LC comprises a region of liquid crystal (assuming that the display is of liquid crystal type) which is contained between a display electrode T, formed upon one of the substrates of the display panel and a reference electrode Z which is generally of planar form and is formed upon the opposing substrate of the display panel. The reference electrode Z is held at a reference potential, such as 0 V. Display information is stored in the form of a potential difference between the display electrode and reference electrode of a display element, and is retained for a certain period of time because of the capacitance of the display element and the isolation which is provided by each switching element in its non-conducting state. If necessary, some additional capacitance can be added to each display element, as denoted by C*. To write in display data, the row electrodes are sequentially scanned by a row drive signal, so that each row of switching elements is successively set into the ON, i.e. conducting, state for a predetermined time interval. During this time interval, the display data which is to be written into a particular row of display elements is provided on the column electrodes 10, when the switching elements of that row are in the conducting state.

Figure 2:
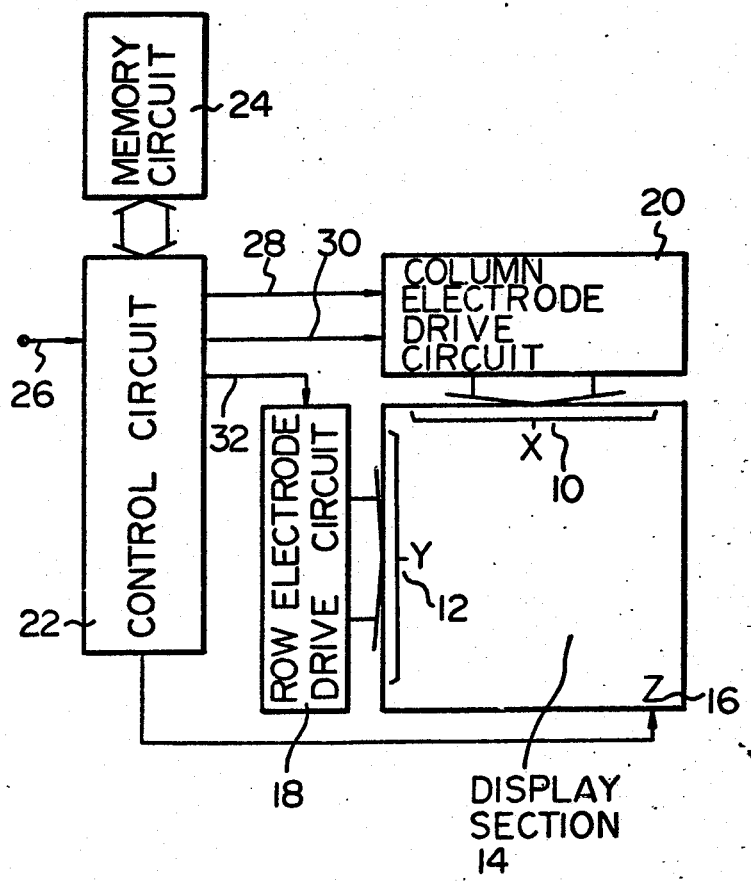
FIG. 2 is an overall block diagram of a display device of the built-in switching element type according to the prior art.

Referring now to FIG. 2, an overall block diagram of a display device of the prior art is shown, which is of the built-in switching element type shown in FIG. 1. Here, numeral 14 represent the display section shown in FIG. 14, numeral 1 denotes a row drive circuit, and numeral 22 a control circuit. Row electrode drive circuit 18 serves to produce scanning signals to sequentially scan the rows of drive elements, as described above, in response to control signals 32 supplied from control circuit 22. Row electrode drive circuit 18 can comprise shift registers for example. Column electrode drive circuit 20 serves to distribute the display data signals, denoted by numeral 30, which are supplied from control circuit 22, as directed by control signals 28, also supplied from control circuit 22.

Generally, display data signals 30 are supplied in serial form, so that column electrode drive circuit 20 must perform serial to parallel conversion operations. This circuit usually comprises shift registers, latch circuits, etc. Control circuit 22 processes various types of data, such as display data input from an external source, as denoted by numeral 26, display data stored in a memory circuit 24, as well as clock signals etc, produced within the control circuit.

It is a particular feature of a display device of the built-in switching element type that the isolation provided by the switching elements S acts to almost completely eliminate cross-talk interference. However, with prior art embodiments of such display devices, various severe problems have arisen. One of the greatest of these problems is that, since each display element has some finite resistance, leakage currents flow through these elements, and also to some extent through the switching elements S, whereby the display data contents (i.e. the potential difference to which each display electrode of the switching elements is charged) continuously deteriorates. It is therefore necessary to repetitively regenerate the display contents. In the prior art, this has been accomplished by storing the display data in memory 24 and repetitively re-writing this display data into the display elements on a regular periodic basis. This writing in of data must be performed irrespective of whether any change in the display contents is to be made, so that provision of a memory circuit 24 is necessary, unless the display data is continuously available from some external source. The amount of memory capacity required can be considerable. If for example the display section has 500×500 elements, then the memory 24 must have a capacity of 250 K bits. Also, as stated above, the stored data must be changed from serial to parallel form at high speed, so that the elements which perform such serial to parallel conversion must operate at high switching speeds. The power consumed by such circuits is therefore substantial, and also a large amount of circuit area must be provided for this purpose. For this reason, it will be apparent that such a prior art type of device is not suited for use in compact or portable equipment.

With such a prior art type of display device, it is only possible to write display data into the display elements. However, as described hereinafter, data can be both written into and read out of a display section of a display device according to the present invention.

Figure 3:
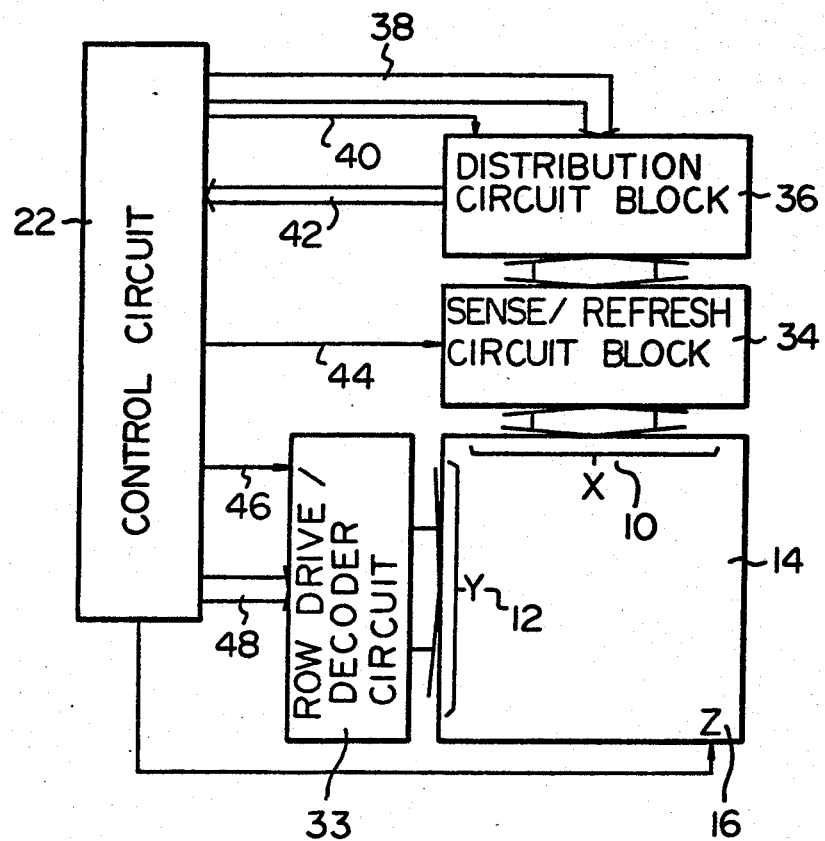
FIG. 3 is an overall block diagram of a display device according to the present invention.

Referring now to FIG. 3, an embodiment of a display device according to the present invention is shown in block diagram form. Numeral 14 again denotes the display section, which is generally of the form shown in FIG. 1, i.e. of the built-in switching element configuration. Numeral 33 denotes a row drive/decoder circuit, Numeral 34 denotes a sense/refresh circuit block, which comprises a plurality of sense/refresh circuits each connected to a corresponding one of the column electrodes 10, as well as a decoder circuit whereby any of the column electrodes can be individually selected. As described hereinafter, each sense/refresh circuit serves to refresh, i.e. to restore the contents of each display element to a value which was previously written into the element as display data, this refreshing or regeneration being performed on the basis of sensing the current contents of each display element. Numeral 36 denotes a distribution circuit, which serves to supply display data signals from a control circuit 22 (denoted by numeral 38) to the column electrodes 10 of the display section, when data is to be written into the display section 14. In this embodiment, the display data is written in via the sense/refresh circuits 34. However it is equally possible to write in the display data through a path which by passes the sense/refresh circuits.

Distribution circuit 36 also serves to transfer the contents of display section 14, sensed by means of sense amplifiers in sense/refresh circuits 34, to the control circuit 22. This is done in a readout mode of operation, described hereinafter. Such data transfer for readout and write-in purposes is denoted by numeral 42. Operation of the sense/refresh circuits is controlled by means of control signals from control circuit 22, as denoted by numeral 44.

Figure 4:
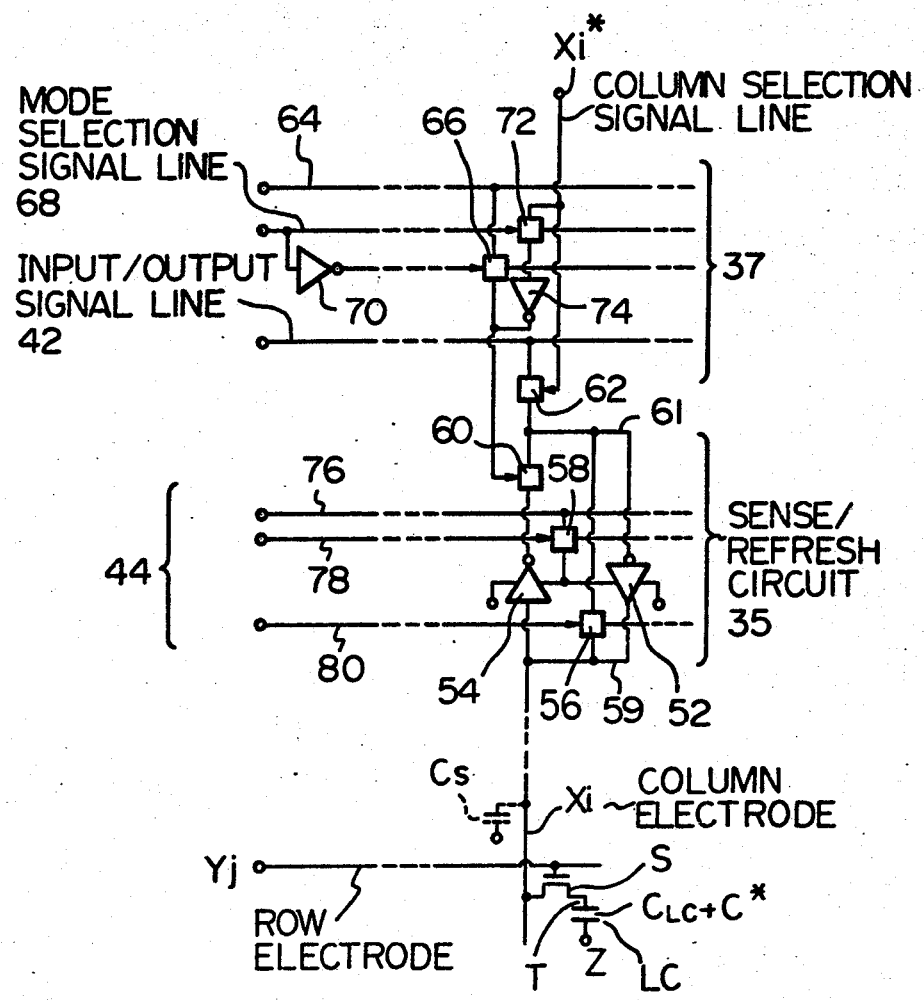
FIG. 4 is a circuit diagram of parts of the device of FIG. 3, showing the configuration of a sense/refresh circuit.

Referring now to FIG. 4, a circuit diagram is shown therein of one of the sense/refresh circuits in circuit block 34 of FIG. 3, denoted by numeral 35. Numeral 37 denotes a portion of the distribution circuit block 36 of FIG. 3, which is coupled to the sense/refresh circuit 35. The column electrode to which sense/refresh circuit 35 is connected is denoted as $X_i$, while selection of column $X_i$ is performed by means of column selection signals applied to a line $X_i^*$, from a column decoder circuit described hereinafter. A typical row electrode $Y_j$ intersects with column electrode $X_i$, and a switching element S is provided at the intersection of $X_i$ and $Y_j$. Switching element S is coupled to a display element LC having a total capacitance of $C_{lc}+C^*$, where $C^*$ is added capacitance which may be provided if necessary. Row electrode $Y_j$ is also connected to a decoder circuit, in the drive/decoder circuit 33 of FIG. 3, and so can be individually selected when required. Cs denotes the stray capacitance which is associated with the column electrode $X_i$, which must be charged and discharged when write-in operations are performed.

Sense/refresh circuit 35 is based upon a latch circuit constituted by two inverters 52 and 54. Electronic switches, generally referred to as transmission gates, are denoted by numerals 56 and 58. These are provided to improve the effectiveness of sensing operation. Transmission gate 58 operates under control of timing signals sent over line 78 from control circuit 22, and serves to isolate inverters 52 and 54 from the power supply voltage of line 76, in the intervals between successive sense/refresh operations. During such intervals, transmission gate 56 is responsive to a timing signal sent over line 80 from control circuit 22 for establishing a short-circuit state between terminals 59 and 61 sense/refresh circuit 35. Numeral 60 denotes a transmission gate which is responsive to an output signal from inverter 74 for isolating the output of inverter 54 from terminal 61. In the sense/refresh mode of operation, transmission gate 60 is held in the ON (i.e. conducting) state, while another transmission gate 62, coupled between terminal 61 and an input/output signal line 42 is held in the OFF (i.e. non-conducting) state.

In the sense/refresh mode, rows of switching elements S are sequentially set in the ON state by means of row drive signals applied to the row electrodes 12 from the row drive/decoder circuit 33. When such a row drive signal is applied to row $Y_j$ shown in FIG. 4, then the contents of display element LC are applied to the column electrode $X_i$. Timing signals are then applied to lines 78 and 80 such that the power on line 76 is supplied to the inverters 52 and 54 of sense/refresh circuit 35, and the short-circuit condition established by transmission gate 56 is released. The bistable circuit formed by inverters 52 and 54 will then attain either of two stable states, with the particular state attained being dependent upon the display content read out from element LC, i.e. depending upon whether the display element is in the excited state, with a potential difference between the display electrode T and the reference electrode Z, or is in the non-excited state, with the display electrode T at the same potential as the reference electrode Z. Even if the potential difference across the display element has dropped to some extent, since the preceding sense/refresh or write-in operation, it will be restored to the full level (i.e. refreshed) by the latching action of the bistable circuit formed by inverters 52 and 54. In the sense/-refresh mode, periodic scanning of the row electrodes in synchronism with the operation of transmission gates 56 and 58 ensures that display data contents held in the display elements are preserved unchanged, without the necessity for rewriting this data into the column electrodes from a memory or external data source.

In this embodiment, the sensing and refresh operations are, in effect performed almost simultaneously by a single bistable circuit. However, it is equally possible to use separate sense amplifier and refresh amplifier (or bistable) circuit means to perform the same function, with the output of the latter circuit being controlled by output signals from the sense amplifier circuit.

In the readout mode of operation, column electrode $X_i$ is selected by means of a column selection signal which is applied to line $X_i^*$, while row $Y_j$ can be selected by a signal applied from the decoder circuit in row driver/decoder circuit 33, i.e. in this mode, individual display elements can be selected by addressing the row and column decoder circuits. The column selection signal serves to set transmission gate 62 to the ON state. Timing signals are then applied to the transmission gates 56 and 58 to cause the bistable circuit of sense/refresh circuit 35 to attain a stable state determined by the contents of the selected display element, in the same way as described above for the sense/refresh mode. This stable state is transferred through transmission gate 62 to the input/output line 42, and hence to the control circuit 22.

In the above description, the method of reading out the contents of a particular display element is given. However, it is of course equally possible to read out the display contents on a row-at-a-time basis, by applying scanning signals sequentially to the row electrodes, and modifying the output circuitry shown in FIG. 4.

In the write-in mode of operation, transmission gate 62 is again set in the ON state by a column selection signal applied to line $X_i^*$. However, in this mode, a mode selection signal applied to line 68 from control circuit 22 acts to inhibit the potential of a line 64 from being applied to a control input of transmission gate 60, via transmission gate 66. As a result, transmission gate 60 enters the OFF state, so that inverter 52 can now be used independently of inverter 54, to write in data. The data to be written into the display element LC is applied in inverted form to the input/output signal line 42, and passes through inverter 52 to the selected column $X_i$. Synchronized with this data input, a row selection signal is applied to row electrode $Y_j$, thereby allowing the display data to be written into element LC.

Another mode of data input can be established, in which data is written into display elements by application of light, from a source such as a light pen to the display section 14. In this case, each switching element S of the display section 14 is constructed such as to undergo a significant increase in conductivity (in the normally OFF state) when it is irradiated with light. In such a light write-in mode, all of the column electrodes 10 are connected to a suitable potential, while the potential applied to the row electrodes 12 is such as to hold the display elements S in the OFF state. Application of light to selected display elements will then cause the switching elements of these display elements to be set in a conducting state, so that a charge is stored into these display elements, i.e. data is written into them. After this data has been written in, the sense/refresh mode can be entered, in which the display data will be held in a constant state.

If deterioration of display contents during such a light write-in mode is a problem then it would be possible to periodically enter the sense/refresh mode for brief periods of time. This would not affect the light write-in operation, if these periods in the sense/refresh mode are of sufficiently short duration.

Figure 5:
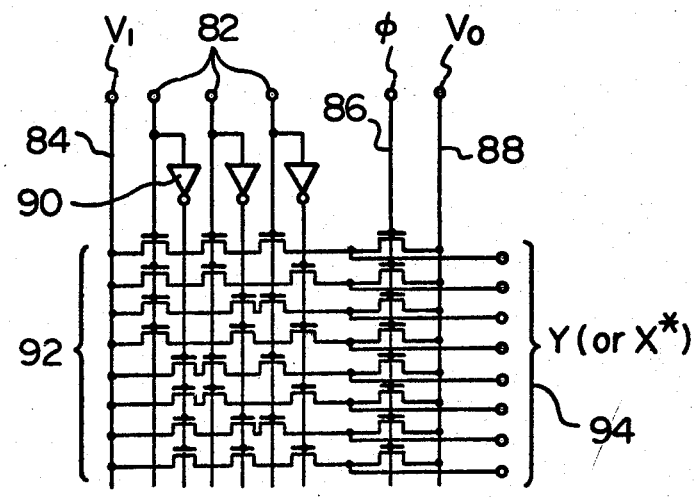
FIG. 5 is a circuit diagram of a decoder circuit suitable for use as a row or column decoder circuit in the embodiment of FIG. 3 and FIG. 4.

It should be noted that the drive configuration of the embodiment described above, whereby individual display elements in the display matrix can be selected for writing in or reading out of data presents various advantages, including simplification of the overall drive circuit arrangement. With a display device of matrix form of the prior art, when it is necessary to write in new data to a portion of the display, then it is generally necessary to scan the entire display matrix by row and column drive signals, i.e. to perform write-in operations for all of the display elements. However, with the present embodiment, by utilizing simple decoder circuits in the row and column drive circuits, such writing-in of unnecessary data can be avoided, as can the need for circuitry to perform such operations. FIG. 5 is a partial circuit diagram of a simple decoder circuit, applicable to thin-film transistor elements, which can be used in the row and column drive circuit blocks 33 and 34 shown in FIG 3. The operation of this circuit will be self-explanatory. Address signals applied to a set of terminals 82 serve to select a particular one of a set of row (or column) electrodes 94, by controlling the operation of an array of switching elements 92. In this way, a potential $V_i$ can be applied to one of the lines 94, with the other lines being held at a potential $V_0$.

It is however equally possible to apply the present invention to a display device in which more conventional drive circuit arrangements such as shift registers are used, to perform serial-to-parallel and parallel-to-serial conversions whereby data can be written into or read out of the display elements, one row at a time.

Since the peripheral circuitry of a display device according to the present invention can utilize circuit elements which need not operate at high switching speeds, it is possible to form all or part of such peripheral circuitry, such as that in circuit blocks 33, 34 and 36 of FIG. 3, directly upon the same display panels as the display elements and the switching elements S of the display elements. In addition to providing a more compact display device, this has the advantage of reducing the unwanted stray capacitances, such as that denoted by $C_s$ in FIG. 4. This serves to enhance the sensitivity of sensing the display element contents by sense/refresh circuit 35. Since the peripheral circuit elements need not operate at high speeds, it is possible to use thin-film circuit elements such as field-effect transistors formed of CdS, CdSe, PbS, Te, amorphous silicon, etc for the components of the peripheral circuitry formed on the display panel.

With the described embodiment of the present invention, the potential difference across each display element is left unchanged in polarity by the sense/refresh operations. However with some types of liquid crystal display panels, it is desirable to drive the display elements with a drive voltage of periodically alternating polarity, in order to improve the stability of the display elements. Such a requirement can be easily met by a display device according to the present invention. For example, the sense/refresh circuit 35 shown in FIG. 4 can be modified such that separate circuits are used to perform the sense and refresh functions respectively, and such that the refresh circuits apply drive potentials of alternating polarity to the column electrodes in successive sense/refresh frame times.

From the above description of the preferred embodiment, it can be understood that a display device according to the present invention provides a data readout capability, in addition to the display data write-in mode of operation provided by display devices of the prior art. In addition, with the sense/refresh mode of operation of a display device according to the present invention, display data which has been written in is thereafter preserved indefinitely (so long as power is applied to the circuits), without any further need for rewriting in of the display data to compensate for deterioration due to leakage effects in the display elements and switching elements of the display section. Thus, the peripheral row and column drive circuitry of a display device according to the present invention can be simpler than that of the prior art, and since such circuitry can operate at relatively low speeds, the circuit elements can be of a type which can conveniently be formed directly upon the display panel containing the display elements. Such a display device is therefore much more suitable for use in compact electronic devices, including electronic timepieces, calculators, etc, then matrix type display devices of the prior art.

It will also be understood that a display device according to the present invention can also be adapted for the writing in of data by application of light to the display elements, by means such as a light pen, etc. Such data, once written in, can be stored for an indefinite period, and can be read out to external circuitry at any time. In addition, with the provision of row and column decoder circuits such as those of the preferred embodiment, any one of the display elements can be individually selected for readout or writing in of display data, so that a display device according to the present invention can also serve as a form of random-access memory device, as well as a display. Such a wide range of functions have not hitherto been available with a display device of matrix type, which is applicable to the use of such material as liquid crystal to form the display elements, and which thus offers the various advantages of low operating voltage, low power consumption and compactness that are provided by a liquid crystal display device.

From the preceding description, it will be apparent that the objectives set forth for the present invention are effectively attained. Since various changes and modifications to the above construction may be made without departing from the spirit and scope of the present invention, it is intended that all matter contained in the above description or shown in the accompanying drawings shall be interpreted in an illustrative, and not in a limiting sense. The appended claims are intended to cover all of the generic and specific features of the invention described herein.

What is claimed is:

1. A matrix array display and memory system, comprising:

a display panel comprising a set of row electrodes and a set of column electrodes, a plurality of switching elements each disposed at a respective intersection of said row and column electrodes and being coupled to one of said row electrodes and responsive to signals applied to said one of the row electrodes for selective switching to a conductive and a non-conductive state, and a plurality of display elements each coupled through a corresponding one of said switching elements to one of said column electrodes, each of said display elements having a predetermined amount of capacitance and being selectively settable to a first display state in which said capacitance is in a charged condition and a second display state in which said capacitance is in a discharged condition;

row drive circuit means coupled to said row electrodes for generating row drive signals to successively set rows of said switching elements into the conductive state during periodically repeated sense/refresh intervals, to thereby successively and periodically couple rows of said display elements to said column electrodes;

distribution circuit means coupled to said column electrodes for applying signals representing digital data thereto, for thereby selectively charging the capacitances of said display elements coupled to said column electrodes, to thereby simultaneously display and memorize said digital data by said display elements;

a plurality of sense/refresh circuits each coupled to a corresponding one of said column electrodes, each of said sense/refresh circuits acting during each of said sense/refresh intervals to first sense a potential appearing upon the corresponding column electrode representing the charge condition of one of said display elements, to then produce an output potential in accordance with said sensed potential, and to thereby drive said one of the display elements to said output potential;

said sense/refresh circuits thereby acting during said sense/refresh intervals to periodically refresh said digital data memorized in said display elements.

2. A matrix display panel and memory system according to claim 1, in which each of said sense/refresh circuits comprises a bistable circuit, with circuit means being provided for changing each of said bistable circuits from a non-operative to an operative condition at the start of each of said sense/refresh intervals.

3. A matrix display panel and memory system according to claim 2, in which each of said bistable circuits comprises a first inverter and a second inverter, with an output terminal of said first inverter being coupled to an input terminal of said second inverter and an output terminal of said second inverter being coupled to an input terminal of said first inverter, first electronic switch coupled between said output terminal and input terminal of said first inverter and second electronic switch coupled between an operating power supply and power supply terminals of said first and second inverters, and circuit means for holding said first electronic switch in an open state and said second electronic switch in a closed state at times other than during said sense/refresh intervals and for holding said first electronic switch in a closed state and said second electronic switch in an open state during said sense/refresh intervals.

4. A matrix display panel and memory system according to claim 3, in which each of said bistable circuits further comprises a third electronic switch coupled between the output terminal of said second inverter and the input terminal of said first inverter, and a fourth electronic switch coupled between the input terminal of said first inverter and a data input/output line of said distribution circuit means, and further comprising mode selection circuit means for selectively establishing a sense/refresh mode of operation in which said third electronic switch is held in the closed state and said fourth electronic switch is held in the open state, a data readout mode in which said third electronic switch and said fourth electronic switch are held in the closed state, and a data write-in mode in which said third electronic switch is held open and said fourth electronic switch is held closed.

* * * * *